Figure 1:
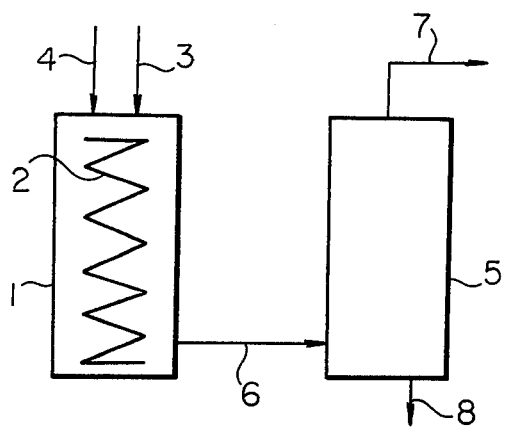

United States Patent [19]

Kimura et al.

[11] 3,933,984
[45] Jan. 20, 1976

[54] PROCESS OF MANUFACTURING WHISKER CRYSTALLINE SILICON CARBIDE

[75] Inventors: Isao Kimura, Suita; Hidetsugu Habata, both of Osaka, Japan

[73] Assignee: Kanegafuchi Boseki Kabushiki Kaisha, Tokyo, Japan

[22] Filed: Mar. 18, 1971

[21] Appl. No.: 125,469

[30] Foreign Application Priority Data
  Mar. 27, 1970  Japan................................. 45-26397
  Mar. 27, 1970  Japan................................. 45-26398
  Apr. 16, 1970  Japan................................. 45-32823

[52] U.S. Cl................................. 423/345; 423/440
[51] Int. Cl............................................. C01b 31/36
[58] Field of Search ....... 23/208; 423/345, 346, 440

[56] References Cited
UNITED STATES PATENTS

| | | | |
|---|---|---|---|
| 3,306,705 | 2/1967 | Leineweber et al. | 423/346 |
| 3,371,995 | 3/1968 | Pultz | 423/346 |
| 3,399,980 | 9/1968 | Bourdeau | 23/208 A X |
| 3,622,272 | 11/1971 | Shyne et al. | 423/346 |
| 3,709,981 | 1/1973 | Lee et al. | 423/346 |

FOREIGN PATENTS OR APPLICATIONS

| | | | |
|---|---|---|---|
| 1,552,005 | 11/1968 | France | 23/208 A |
| 1,184,739 | 1/1965 | Germany | 23/208 A |
| 1,563,415 | 3/1969 | France | 423/345 |

*Primary Examiner*—Edward J. Meros
*Assistant Examiner*—Eugene T. Wheelock
*Attorney, Agent, or Firm*—Woodhams, Blanchard & Flynn

[57] ABSTRACT

Whisker crystalline silicon carbide is prepared by heating a silicon-containing material for example, elemental silicon, silicon oxides, silicon hydroxides, silicon salts and the like with a halogen and carbon-containing material, such as a mixture of hydrocarbon and chlorine-containing material selected from chlorine, hydrogen chloride, tetrachloromethane and phosgene and halogenated hydrocarbon at a temperature of 800°C or higher under a substantial oxygen and nitrogen gas-free condition.

10 Claims, 2 Drawing Figures

PROCESS OF MANUFACTURING WHISKER CRYSTALLINE SILICON CARBIDE

The present invention relates to a process of manufacturing whisker crystalline silicon carbides and, more particularly, relates to a process of manufacturing whisker crystalline silicon carbides from a silicon-containing inorganic material and a halogen and carbon containing material.

The term "whisker crystal or whisker" as used herein, refers to a needle-like single crystal, which includes no transition defect substantially, having a diameter of a few microns and a length of several millimeters. Recently, the whisker is spotlighted as a new material useful for industrial uses owing to its very high mechanical strength which is several tens or several hundreds times the strength of the conventional fibrous material consisting of the same substance as that of the whisker.

The whisker crystal can consist of metals, metal carbides, metal oxides, metal borides or metal nitrides and has excellent physical and mechanical properties, such as heat resistivity, modulus and tensile strength, which are much higher than those of the conventional materials such as plastic and ceramics, and much lower apparent specific gravity. Some whiskers selected from the practical whiskers have a superior tenacity which approximately equals the value theoretically calculated from the constituent unit of the material forming the whisker.

For concretely illustrating features and advantages of the whisker, a comparison of physical properties of silicon carbide whisker with respect to those of an alkali-free glass fiber which is useful for reinforcing composite materials as a conventional fibrous inorganic material is shown in Table 1.

Table 1

| Material Item | Glass fiber | Silicon carbide whisker |
|---|---|---|
| Phase | Supercooled amorphous liquid | Single crystal |
| Configuration | Cross-section: circle  Surface: considerably smooth | Cross-section: uneven polygon  Thickness: nonuniform |
| Diameter ($\mu$m) | 3 – 10 | 0.1 – 20 |
| Length (mm) | endless | 0.1 – 20 |
| Chemical formula | Mixture of $SiO_2$, $Al_2O_3$, CaO and other | SiC |
| Density (g/cm) | 2.55 | 3.17 |
| Melting point or softening point (°C) | 700 | 2690 |
| Tensile strength (kg/mm) | 350 | 2110 |
| Specific (*1) tenacity (cm × $10^4$) | 14 | 66 |
| Modulus of longitudinal elasticity (kg/mm$^2$) (*2) | 7400 | 49200 |
| Specific coefficient of elasticity (cm × $10^6$) (*3) | 290 | 1540 |

Note:
(*1) The term "specific tenacity" means tensile strength/density.
(*2) The term "modulus of longitudinal elasticity" means Young's modulus.
(*3) The term "specific coefficient of elasticity" means Young's modulus/density.

Referring to Table 1, the silicon carbide whisker has a much higher melting point than that of the glass fiber, a superior tensile strength which is about six times that of the glass fiber, an excellent Young's modulus which is about seven times that of the glass fiber and a high specific tenacity and specific coefficient of elasticity which are five times these of the glass fiber. Accordingly, it is obvious that the carbide whisker has excellent properties valuable for industrial use. Owing to the excellent properties and advantages of the whisker, it is expected that the whisker is utilized in wide industrial fields such as the space development industry and aircraft industry. For example, the whisker can provide various new materials having superior features and advantages by combining it with the conventional material such as metals, ceramics and plastics.

Recently, various processes have been provided for manufacturing the whisker crystalline silicon carbide. That is, these known processes include a method of producing the silicon carbide whisker by reacting silicon tetrachloride with tetrachloromethane or lower hydrocarbon at a high temperature using hydrogen gas as a carrier and a method of producing the silicon carbide whisker by gasifying and heat-decomposing organic silicon compounds at a high temperature using hydrogen gas as a carrier.

However, in the above-mentioned conventional method of manufacturing the silicon carbide whisker, it is difficult to obtain large quantities of most of the component materials to be applied to the method owing to low production thereof and high cost due to the high purity thereof. The above-mentioned undesirable features of the whisker crystalline silicon carbide cause much difficulty for readily and industrially producing same with a low cost. Therefore, the above conventional methods are merely effected on a laboratory scale. Accordingly, a process of manufacturing the whisker crystalline silicon carbide with an industrial merit is not available yet.

An object of the present invention is to provide a process of manufacturing whisker crystalline silicon carbide from crude materials having a low purity with a high yield.

Another object of the present invention is to provide a process of manufacturing whisker crystalline silicon carbide on an industrial scale with an easy processability by a simple apparatus.

Figure 2:
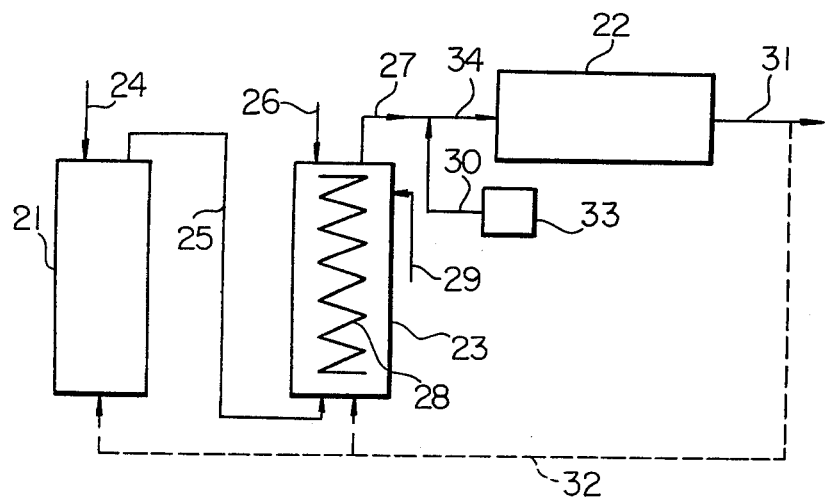

These and other objects and features of the present invention will become apparent to those skilled in the art upon reading the more detailed description referring to the accompanying drawing, wherein FIG. 1 shows an embodiment of the apparatus usable for effecting the process of the present invention, and FIG. 2 shows another embodiment of the apparatus usable for effecting the process of the present invention.

According to the process of the present invention, a reaction system which contains a silicon-containing material and a halogen and carbon-containing material is heated at a temperature not lower than 800°C under an oxygen and nitrogen gas-free condition. The halogen and carbon-containing material is selected from a mixture containing hydrocarbon and a chlorine-containing material selected from chlorine, hydrogen chloride tetrachloromethane and phosgene and halogenated hydrocarbon containing at least 5 percent by weight of chlorine.

The silicon-containing material capable of being applied to the process of the present invention refers to materials containing a silicon element as a component, and can be selected from elemental silicon, silicon alloys, silicon containing inorganic oxides, silicon-containing salts, silicon-containing hydroxides, and silicon-containing inorganic chlorides. The elemental silicon refers to metallic crystalline silicon and amorphous silicon preferably having a purity not lower than 70 percent. The silicon alloys can be selected from Si-Fe, Si-Ni, Si-Al, Si-Cu, Si-Zn, Si-Ca and the like. The silicon containing oxides can be selected from silicon monoxide, silicon dioxide, portland cement, white portland cement, glass such as soda glass, boro-silicate glass, and silica glass, and sintered materials from silicate containing material such as siliceous stone, siliceous sand, kaolin group and feldspars. The silicon containing salts can be selected from silicate such as magnesium silicate, calcium silicate, aluminum silicate, siliceous stone, siliceous sand, feldspars, and kaolin groups. The silicon-containing hydroxides can be selected from orthosilicic acid, metasilicic acid, mesodisilicic acid, mesotrisilicic acid, mesotetrasilicic acid and silica gel.

The silicon-containing material usable for the process of the present invention can be used as a simple material or a mixture of the above-mentioned substances, for example, a mixture of metallic silicon and silicon alloy, silicon dioxide or metasilicic acid, and can contain other materials than the above-mentioned substances.

The silicon-containing material can be in any form such as lumps, grains or powder. For example, the metallic silicon and silicon alloys can be in a lump form. However, other materials than the metallic silicon and silicon alloys are preferably in fine particle form having a size not exceeding 300 μm, more preferably, not exceeding 100 μm.

The chlorine-containing material usable for the process of the present invention is selected from chlorine, hydrogen chloride, phosgene and tetrachloromethane, which are in a gas phase under normal conditions or at an elevated temperature.

The hydrocarbons usable for the process of the present invention can be selected from aliphatic hydrocarbons, alicyclic hydrocarbons, aromatic hydrocarbons, polyolefin, polystyrene and the like. The aliphatic hydrocarbons can be selected from methane series compounds such as n-paraffins, for example, methane, ethane, propane, butane, pentane, hexane, heptane, octane, nonane, decane, undecane, dodecane, tridecane, tetradecane, pentadecane, hexadecane, heptadecane, octadecane, nonadecane, eicosane, heneicosane, docosane, tricosane, tetracosane and pentacosane and iso-paraffins corresponding to the above n-paraffins; ethylene series compounds such as ethylene, propylene, butylene, isobutylene, amylene, isoamylene, tetramethylethylene, heptene, octene, nonene, and decene; and acetylene series compounds such as acetylene, methyl acetylene, butyne, pentyne, hexyne, heptyne, octyne, nonyne, and decyne.

The n- and iso-paraffins suitable for the process of the present invention preferably contain 1 to 10 carbon atoms.

The alicyclic hydrocarbons can be selected from cycloparaffins containing 3 to 8 carbon atoms such as cyclopropane, cyclobutane, cyclopentane, cyclohexane, cycloheptane, and cyclooctane; and cycloolefins such as cyclopropene, cyclobutene, cyclopentene, cycloheptene, cyclooctene, cyclononene, and cyclodecene.

The aromatic hydrocarbons can be selected from benzene, toluene, xylene, hemimellitene, pseudocumene, mesitylene, prehnitene, isodurene, durene, pentamethyl benzene, biphenyl, diphenyl methane, indene, naphthalene, tetrahydronaphthalene, anthracene and phenanthrene. The polyolefin includes polyethylene and polypropylene.

The hydrocarbons usable for the process of the present invention can include a wide range of various organic polymeric materials, waxes which are esters of fatty acids and water-insoluble primary or secondary higher fatty alcohols, tung oil, kerosene heavy oil, and tars, pitches and asphalts.

The halogenated hydrocarbons usable for the process of the present invention can be selected from high and low molecular weight fluorinated, chlorinated, brominated and iodinated hydrocarbons having a halogen content not lower than 5 percent by weight, preferably, not lower than 10 percent by weight. Particularly, the halogenated hydrocarbons are preferably selected from chlorinated hydrocarbons such as chlorinated aliphatic, alicyclic, and aromatic hydrocarbons, for example, ethylene dichloride, tetrachloroethane, tetrachloroethylene, methyl chloride, ethyl chloride, vinyl chloride, monochlorobenzene, dichlorobenzene; benzene hexachloride; chlorinated paraffins; chlorine-containing polymers such as polyvinyl chloride; polyvinylidene chloride; vinyl chloride copolymers, vinylidene chloride copolymers, chlorinated polyethylene, chlorinated polypropylene, chlorinated polystyrene, chloro-sulfonated polyethylene, chlorinated polyvinyl chloride and chlorinated polyvinylidene chloride.

The chlorinated hydrocarbons can include other chlorine-containing organic compounds such as benzyl chloride and het acid having the formula:

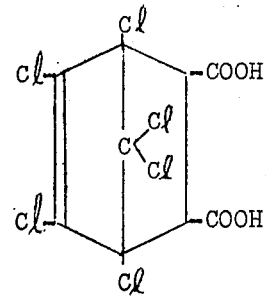

As stated above, the chlorinated hydrocarbons suitable for the process of the present invention have a chlorine content of at least 5 percent, preferably, at least 10 percent by weight, and can be a mixture of at least two different chlorinated hydrocarbons, or of the chlorinated hydrocarbon and other chlorine-containing organic compounds, for example, the chlorinated paraffin and the het acid, the tetrachloroethylene which is in liquid phase at room temperature and the polyvinyl chloride which is in solid phase at room temperature.

The above-mentioned chlorinated hydrocarbons can gasify or decompose at a high temperature so as to produce gaseous compounds having a low boiling point under a normal condition. In a preferable embodiment of the process of the present invention, the reaction system consists of the silicon-containing material, the chlorine-containing material as defined above and the hydrocarbon. In another embodiment of the process of the present invention, the reaction system consists of the silicon-containing material, the chlorine-containing material as defined above, the hydrocarbon and the halogenated hydrocarbon. The reaction system, in a further embodiment, consists of the silicon-containing material and the halogenated hydrocarbon. Further, the reaction system consists, in still another embodiment, of the slicon-containing material, the halogenated hydrocarbon and the chlorine-containing material as defined above.

According to the process of the present invention, the reaction system is heated at a temperature not lower than 800°C, preferably, 1000° to 2200°C, more preferably, 1200° to 2000°C in the substantial absence of oxygen and nitrogen gases. It is permissible to preheat the reaction system or some components of the reaction system at a temperature of 100°C or higher, preferably 400°C or higher, more preferably, 800°C or higher. In the above case, it is required to finally heat the reaction system at a temperature not lower than the preheating temperature and not lower than 800°C. The preheating temperature can be optionally adjusted in consideration of chemical and physical properties of the materials used in the reaction system.

In an embodiment of the process of the present invention, the silicon-containing material is preheated together with the chlorine-containing material at a temperature not lower than 100°C, the resultant gas from the preheating is mixed with the hydrocarbon and/or the halogenated hydrocarbon, and then the mixture is heated at a temperature not lower than 800°C in the substantial absence of oxygen and nitrogen gases.

In the case of the above embodiment, it is preferable that the chlorine-containing material to be preheated together with the silicon containing material is one of chlorine and carbon-containing material such as tetrachloromethane. Also, it is preferable that the preheating system further contains carbon-containing material such as hydrocarbons, graphite, amorphous carbon and active carbon, if the chlorine-containing material contains no carbon.

In another embodiment of the process of the present invention, the mixture of the silicon-containing material and the halogenated hydrocarbon is preheated at a temperature not lower than 100°C, and the resultant gas is heated at a temperature not lower than 800°C in the substantial absence of oxygen and nitrogen gases.

In another embodiment of the process according to the present invention, the silicon-containing material is charged into a heat resistant container, a mixture gas of the gaseous hydrocarbon and the gaseous chlorine-containing material is fed into the container through an inlet thereof, the container containing the above components is heated to a temperature not lower than 800°C, preferably not lower than 1000°C, and the resultant gas in the container is discharged to the outside of the container through an outlet thereof. Through the above process, the whisker crystalline silicon carbide is produced in the container. In the above case, when the chlorine-containing material is in gas phase at room temperature, the gaseous chlorine-containing material is preheated together with the silicon-containing material and the hydrocarbon, if necessary, and the halogenated hydrocarbon at a temperature not lower than 400°C, and the resultant gas from the preheating is heated at a temperature not lower than the preheating temperature and not lower than 800°C. This process is suitable for obtaining a good result.

When the mixture of the chlorine containing material as defined above and the hydrocarbon or the halogenated hydrocarbon is in gas phase at room temperature, the above gaseous halogen and carbon containing material is contacted with the silicon containing material heated to a temperature not lower than 800°C. In this case, it is preferable that the halogen and carbon-containing material has a halogen content of 5 to 50 more preferably 10 to 40, still preferably 15 to 30 percent by mole. When the halogen content is lower than 10 percent by mole the yield of the whisker crystalline carbide is much lower, and the resultant crystals have a much shorter length, a much lower purity and an undesirable color. Compared with this, when the halogen content is higher than 50 percent by mole, the yield of the whisker crystalline silicon carbide becomes much lower owing to the fact that a large amount of the halogen obstructs the growing of the silicon carbide whisker crystals, and the reaction container is corroded by action of the halogen.

The reaction system according to the present invention may contain a small amount of hydrogen gas.

The whisker crystalline silicon carbide forming reaction according to the present invention is effected at a temperature not lower than 800°C, preferably, 1000° to 2200°C, more preferably, 1200° to 2000°C. When the reaction temperature is lower than 800°C, the silicon carbide forming reaction is so insufficiently effected that the whisker crystals can not be formed. Contrarily, when the reaction temperature is higher than 2200°C, it is required to carefully collect the resultant silicon carbide because of its tendency to sublimate or heat-decomposition.

The hydrocarbon and/or halogenated hydrocarbon is effective for lowering the reaction temperature and preheating temperature required for producing the whisker crystalline silicon carbide from the reaction system containing the silicon containing material and the chlorine and carbon containing material, and valuable for obtaining the whisker crystalline silicon carbide having a high purity through a readily industrial process.

The whisker crystalline silicon carbide forming reaction may be effected under atmospheric or elevated pressure conditions.

When, in the materials to be applied to the reaction system, only the chlorine-containing material is in gas phase at an ambient condition, the whisker crystalline silicon carbide forming reaction is preferably carried out through the following process. That is, the silicon-containing material is charged into a reaction container in a powder form and preheated to a temperature, for example, of 400° to 800°C, the gaseous chlorine-containing material is fed into the reaction container together with the hydrocarbon and/or the halogenated hydrocarbon so as to contact the silicon-containing material. The fed hydrocarbon and/or the halogenated hydrocarbon is gasified or decomposed at a high temperature in the presence of the chlorine-containing material gas so as to produce a gasified gas or decomposed gas, the resultant gas reacts with the silicon-containing material and the whisker crystalline silicon carbide is formed through various intermediates such as halogenated silicon or halogenated organic silicon compounds.

The above reaction process will be illustrated in more detail with reference to FIG. 1 of the accompanying drawing.

Referring to FIG. 1, a reactor 1 is provided with an agitator for agitating the contents in the fixed bed or fluidized bed 2. Particularly, the fluidized bed 2 is effective for continuously producing the intermediate compounds containing silicon by heating the materials charged into the reactor 1. The silicon-containing material is fed into the reactor 1 through a conduit 3 and preferably preheated to a temperature of 400° to 800°C. The halogen and carbon-containing material such as halogenated hydrocarbons and mixtures of the hydrocarbons and the chlorine-containing material as defined above is fed into the reactor 1 through a conduit 4. Accordingly, the silicon-containing material and the halogen and carbon-containing material are preheated in the reactor, so as to produce the halogenated silicon compounds as intermediates. The feed of the silicon-containing material may be carried out after or simultaneously with the feeding of the halogen and carbon-containing material. Also, the hydrocarbon may be fed into the reactor 1 simultaneously or separately from the feed of the chlorine-containing material or halogenated hydrocarbon. The silicon containing material may be charged into the reactor 1 together with a reducing material such as carbon powder at a high temperature. It is preferable that the reactor 1 contains substantially no oxygen or nitrogen gases. However, the reactor 1 may contain inert gas such as neon and argon. Since the silicon-containing material can not be converted to the halogenated silicon intermediate compound at the temperature lower than 400°C, it is undesirable that the preheating temperature is lower than 400°C.

The resultant gas from the preheating which comprises gaseous halogenated silicon or halogenated organic silicon compounds, lower hydrocarbon gas and other carbon-containing compounds is fed into a whisker former 5 through a conduit 6 and heated at a temperature not lower than 800°C, preferably, 1000° to 2200°C in the substantial absence of oxygen and nitrogen gases so as to form the whisker crystalline silicon carbide. In the above process it is preferable that the resultant gas from the preheating step is fed into the whisker former 5 in a flow rate of 0.0007 to 5 l/min, more preferably, 0.001 to 1 l/min, still preferably, 0.0035 to 0.02 l/min through a cross-sectional unit area of 1 cm² of the whisker former 5 at a right angle with respect to the flowing direction of the gas. When the flow rate is smaller than 0.0007 l/min, the productivity of the whisker crystalline silicon carbide and energy efficiency is undesirably lowered. When the flow rate is greater than 5 l/min, the resultant silicon carbide whisker crystals have a shorter length owing to undesirable discharging of the sublimated silicon carbide to outside the whisker former 5. The short length crystals have a lower purity and are undesirably colored yellow green.

In order to control the flow rate, it is permissible to introduce hydrogen gas into the whisker former 5.

When the preheating container 1 and the whisker former 5 contain substantially no oxygen and nitrogen gases, the reaction forms a good result. If the preheating container 1 and the whisker former 5 contain oxygen and nitrogen gases, the resultant whisker crystals are formed at a very much lower velocity with a very much lower yield and contain undesirable impurities such as silicon nitride.

In order to obtain the whisker crystalline silicon carbide with a high yield and efficiency, it is desirable that the preheating and reaction are effected under a high pressure. However, the high pressure is limited in consideration of mechanical strength of the container and reactor forming material, such as ceramic. An exhaust gas produced in the whisker former 5 is discharged to the outside thereof through a conduit 7. The resultant whisker crystalline silicon carbide in the reactor 5 is collected through a conduit 8.

The above-stated apparatus of FIG. 1 has both the reactor 1 and the whisker former 5 disposed separately from one another. However, the process of the present invention can be carried out using only one whisker former. In the above case, the whisker former may contain a low temperature zone for preheating the materials and a high temperature zone for forming the whisker crystalline silicon carbide. Also, the whisker former may be heated as a whole at a temperature not lower than 800°C, preferably, 1000° to 2200°C. Even in this case, the whisker crystalline silicon carbide can be obtained in a high yield.

In the process of the present invention, the resultant silicon carbide is crystallized at an outlying portion having relatively lower temperature of the whisker former heated to a temperature not lower than 800°C into a whisker form.

When some insertions such as fibers, rods or plates are set in the whisker former, the resultant silicon carbide in the whisker former is crystallized on the insertion surfaces with a high density and the crystals grow.

In the process of the present invention, it is desirable that the chlorine-containing material is used in such an amount that the chlorine content is 0.1 to three times, more preferably, 0.5 to two times, the quantity of the chlorine necessary for completely converting the silicon contained in the silicon-containing material to silicon tetrachloride.

Also, in the process of the present invention, it is preferable that the hydrocarbon and the halogenated hydrocarbon is used in such an amount that the carbon content is of 3 to 20 times the quantity of the carbon necessary for completely converting the silicon in the silicon-containing material to silicone carbide, and that the hydrogen is used in an amount of one to 10 times the quantity necessary for completely eliminating the hydrochloric acid from the silicon tetrachloride formed in the reactor. If the quantities of the chlorine-containing material, hydrocarbon and halogenated hydrocarbon are smaller than the respective lower limits, the partial pressure of the silicon-containing compound gas in the reactor is so undesirably high as to result in a low yield of the silicon carbide. If the quantities of these are greater than the respective upper limits, the partial pressure of the silicon-containing compound gas in the reactor is so undesirably low as to result in low yield of the silicon carbide.

The process of the present invention may be effected through the following steps. That is, the silicon-containing material is preheated at a temperature not lower than 100°C in the presence of the chlorine and carbon containing material or a gas produced by heating the chlorine and carbon-containing material, the resultant gas obtained from the above preheating is mixed with hydrogen gas or hydrocarbon gas and then, the mixed gas is heated at a temperature not lower than 800°C in the substantial absence of oxygen and nitrogen gases so as to form the whisker crystalline silicon carbide.

The above procedure will be illustrated in more detail with reference to FIG. 2 of the accompanying drawings.

Referring to FIG. 2, a gas geenerator 21 is disposed for generating a halogen-containing gas from the chlorine-containing material as defined above and the halogenated hydrocarbon. When the chlorine containing material or the halogenated hydrocarbon is in gas phase under normal conditions, the gas generator 21 is a gas container or bomb. When liquid or solid halogenated hydrocarbons such as polyvinyl chloride or chlorinated paraffin or tetrachloromethane is utilized for the process, the gas generator 21 effects the generating of gasified gas or decomposition gas by heating the material.

The gas generator 24 is provided with a conduit 21 for feeding the chlorine-containing material or the halogenated hydrocarbon thereinto.

When the material fed into the gas generator 21 is in liquid or solid phase under normal conditions, the material is heated at a temperature of 50° to 1000°C for generating gasified gas or decomposition gas containing halogen from the material. When the material fed into the gas generator 21 has a low boiling point as that of tetrachloromethane and ethylene dichloride, the material may be gasified by flowing in a carrier gas such as hydrogen gas or chlorine gas at room temperature. The halogen-containing gas generated in the gas generator 21 is fed into a reactor 23 through a conduit 25. The reactor 23 is provided with a conduit 26 for feeding the silicon-containing material thereinto, and an agitator, fixed bed or fluidized bed 28. The silicon-containing material which is in a fine powder form or a grain form is fed into the reactor 23 through the conduit 26. In this step, the silicon-containing material may be previously mixed with a powdered reducing material such as carbon. Also, it is permissible to allow previously mixing of the halogen-containing gas with a reducing gas such as carbon monoxide gas before feeding same into the reactor 23.

The silicon-containing material is preheated in the presence of the halogen-containing gas in the reactor 23 at a temperature not lower than 100°C, preferably, 100° to 1500°C, more preferably 200° to 1300°C.

In the case when only the chlorine-containing material is fed into the gas generator 21, the resultant gas produced by the preheating in the reactor 23 is discharged through a conduit 27 and mixed with the hydrocarbon gas fed from a container 33 thereof into the conduit 27 through a conduit 30 so as to form a reaction gas. The reaction gas is fed into a whisker former 22 through a conduit 34 and heated at a temperature not lower than 800°C and the preheating temperature so as to form the whisker crystalline silicon carbide, under a substantial oxygen and nitrogen gas-free condition. In the case where the halogenated hydrocarbon is fed into the gas generator 21, the resultant gas from the preheating in the reactor 23 is fed, as a reaction gas, into the whisker former 22 through conduits 25 and 34 and subjected to the whisker formation.

The resultant gas from the preheating may be stored in a gas storage disposed outside the process line and fed from the storage into the whisker former 22 when necessary.

The reaction gas is heated in the whisker former 22 at a temperature not lower than 800°C and the preheating temperature, preferably, 1000 to 2200°C, more preferably, 1200° to 2000°C in the substantial absence of oxygen and nitrogen gases so as to form the whisker crystalline silicon carbide in the whisker former 22. A waste gas remaining in the whisker former 22 is discharged therefrom through a conduit 31. If necessary, the waste gas is recycled into the gas generator 21 or the reactor 23 through a conduit 32. If necessary, hydrogen gas may be fed into the reactor 23 through a conduit 29 in order to control the gas flow rate in the reactor 23.

It is desirable, for obtaining a good result, that the reactor 23 contains substantially no oxygen or nitrogen gases. However, it is necessary that the whisker former 22 does not substantially contain oxygen and nitrogen gases either. When the whisker former contains oxygen and/or nitrogen gas, the silicon-containing material is converted to silicon carbide in a very low converting rate, the silicon carbide is formed into the whisker crystals at a very low crystallization velocity and undesirable impurities such as silicon nitride and silicon oxide are mixed in the result.

In order to obtain the whisker crystalline silicon carbide with a high yield, it is desirable that the process line is under a highly pressured condition. However, when the gas generator 21, reactor 23 and whisker former 22 is formed with a ceramic material, the above pressured condition is limited under a certain upper limit.

Table 2 shows some combinations of materials which may be applied for the process of the present invention when the process system as shown in FIG. 2 is utilized.

Table 2

| Combination No. | Material to be fed into gas generator 21 through conduit 24 | Material to be fed into reactor 23 through conduit 26 | Material to be fed into whisker former 22 through conduit 30 |
|---|---|---|---|
| 1 | $Cl_2$ | Metallic silicon or silicon alloys (including metallic mixture containing silicon) | Hydrocarbon |
| 2 | HCl | " | " |
| 3 | $Cl_2$ + CO | " | " |
| 4 | $COCl_2$ | " | " |
| 5 | $COCl_2$ + CO | | |
| 6 | $CCl_4$ | " | " |
| 7 | Chlorinated hydrocarbon | " | " |
| 8 | $Cl_2$ | Silicon dioxide, silicic acid or mixture of the above and carbon | |
| 9 | HCl | " | " |
| 10 | $Cl_2$ + CO | Silicon dioxide or silicic acid | " |
| 11 | HCl + CO | " | " |
| 12 | $COCl_2$ | " | " |
| 13 | $CCl_4$ | " | " |
| 14 | Chlorinated hydrocarbon | " | " |

Referring to Table 2, it is desirable, for obtaining a good result, that the silicon alloys or the metallic mixture containing silicon includes at least 60 percent by weight of silicon.

The process of the present invention can be effected through the following steps. That is, the silicon-containing material is preheated together with the halogenated hydrocarbon and the resultant gas from the preheating is further heated at a temperature not lower than 800°C and not lower than the preheating temperature in the substantial absence of oxygen and nitrogen gases. The silicon-containing material is preferably mixed with the halogenated hydrocarbon in a ratio by weight of 90 : 10 to 10 : 90 and preheated in a reactor at a temperature not lower than 100°C, more preferably, 100° to 1500°C, still more preferably, 200° to 1300°C. Through the preheating, the silicon-containing material and the halogenated hydrocarbon produce various gaseous compounds by gasification or decomposition thereof.

The resultant gas is fed into a whisker former and heated at a temperature not lower than 800°C and not lower than the preheating temperature so as to form the whisker crystalline silicon carbide. The reactor is preferably provided with an agitator, fixed bed or fluidized bed for the charge. The resultant gas from the preheating may be stored in a gas storage resisting high pressure and fed into the reactor when necessary.

Hydrogen gas may be fed into the reactor as a carrier gas for controlling the flow rate of the gas fed into the reactor.

When the preheating according to the process of the present invention is performed at a temperature not exceeding 800°C, the reactor may be made of a conventional steel material. When the preheating is carried out at a temperature higher than 800°C, it is desirable that the reactor is made of a ceramic material. Also, the whisker former has to be made of the ceramic material. The ceramic material used herein refers to carbon including graphite, silica, including quartz, alumina including corundum, zirconia, calcia, magnesia, mullite, silimanite, various carbides such as silicon carbide, and various nitrides such as boron nitride and silicon nitride. Also, the whisker former and the reactor may be made of platinum or its alloys, tantalum or titanium or its alloys.

According to the process of the present invention, it becomes possible to industrially manufacture the whisker crystalline silicon carbide having a purity of 95 percent by weight or more from crude materials which can be readily obtained and easily handled in a high yield of 65 to 90 percent based on the original weight of silicon contained in the crude material. The resultant whisker crystals of the silicon carbide from the process of the present invention have a fine and long needle-like form due to its small diameter of 0.01 to 10 $\mu$m, and a large length of 1 to 20 mm, which configurations are never found in the conventional whisker crystals of the silicon carbide. Further, the whisker crystalline silicon carbide according to the present invention has an excellent tensile strength and modulus and thus, is valuable for reinforcing various materials such as plastics, ceramics and metallic materials. The following examples are intended to merely illustrate the art of the present invention in detail.

EXAMPLE 1

A horizontally laid alumina tube have an internal diameter of 3.6 cm and a length of 70 cm was charged with 4.0 g of powdered porous fire brick, containing 51.4 percent by weight of silicon dioxide at a middle portion of about 10 cm length thereof. The tube was put in a heating furnace. A mixed gas consisting of 77 percent by mole of propane and 23 percent by mole of hydrogen chloride was introduced into the above middle portion at a flow rate of 32 ml/min for 90 minute while heating the middle portion to a temperature of 1500°C in order to react them. In this heating, the middle portion of the alumina tube was effectively heated extending over a length of about 40 cm to a temperature of 1000°C or higher. The inner pressure of the reaction system in the alumina tube was similar to atmospheric pressure since an exhaust gas from the reaction system was discharged to atmosphere. After the reaction for 90 minutes was completed, the feeding of the mixed propane and hydrogen chloride gas was stopped, the alumina tube was taken out of the heating furnace, and then the reaction product, which was white whisker crystals was collected from the alumina tube.

The resultant whisker crystals were heated at a temperature of 1000°C in a heating furnace in the presence of air for 30 minutes in order to eliminate carbon adhered to the whisker crystals. Measuring the weight of the result, the yield of the whisker crystals was 1.25 g. The above yield corresponded to 93.7 percent by weight with respect to a theoretical yield calculated from the silicon content in the material. Through elementary analysis and X-ray analysis, it was recognized that the resultant whisker crystals were composed of $\beta$-type silicon carbide having a purity of 99 percent. The resultant silicon carbide whisker crystals had a diameter of about 0.05 to about 3.0 $\mu$m, a length of about 3.0 to about 41 mm, the physical properties such as a tensile strength of about 2,200 kg/mm$^2$ and a modulus of longitudinal elasticity of about 51,000 kg/mm$^2$.

EXAMPLE 2

The same alumina tube as that of Example 1 was charged with 5.8 g of calcium silicate grains having a purity of 98 percent by weight and then put in a heating furnace. A mixed gas consisting of 80.5 percent by mole of propane and 19.5 percent by mole of chlorine gases was introduced at a flow rate of 55 ml/min for 60 minutes into the alumina tube of which the content was heated at a temperature of 1500°C in order to react them. The reaction system was adjusted to an inner pressure higher by 0.2 atm than atmospheric pressure by controlling a discharging rate of exhaust gas from the reaction system.

After the reaction was completed, the alumina tube was taken out from the furnace, and the reaction product, which was whisker crystalline silicon carbide, was collected. The result was heated to 1000°C in a heating furnace for 15 minutes in the presence of air and then subjected to weighing. The weight of the resultant whisker crystals was 1.72 g which corresponds to a yield of 86 percent by weight.

It was recognized that the result consisted of whisker crystalline silicon carbide having a purity of 98 percent and had a diameter of about 0.1 to about 5 μm, a length of about 1.0 to 38 mm, a tensile strength of about 2,100 kg/mm² and a modulus of longitudinal elasticity of about 49,000 kg/mm².

EXAMPLE 3

Eight alumina tubes, the same as that of Example 1, were charged with 6.0 g of a powdered porous fire brick containing 51.4 percent by weight of silicon dioxide and then placed in a heating furnace.

Mixture gases consisting of 97.5, 95.0, 90.0, 80.0, 70.0, 60.0, 50.0 and 40.0 percent by mole of toluene gas, which was previously prepared by heating and 2.5, 5.0, 10.0, 20.0, 30.0, 40.0, 50.0 and 60.0 percent by mole of hydrogen chloride gas, were flowed at a flow rate of 35 ml/min for 2 hours into the above alumina tubes wherein the content was heated at a temperature of 1450°C in order to react them, respectively. After the reactions were completed, air was introduced into the tubes at a high temperature in order to eliminate carbon remaining on the results which were whisker crystalline silicon carbide, and then the resultant whisker crystals were collected.

Table 3 shows chlorine contents in the mixture gas and yields of the whisker crystalline silicon carbide corresponding to the hydrogen chloride contents.

Table 3

| Content of hydrogen chloride in % by mole | 2.5 | 5.0 | 10 | 20 | 30 | 40 | 50 | 60 |
|---|---|---|---|---|---|---|---|---|
| Yield of whisker crystal in % by weight | 11.9 | 31.2 | 71.6 | 96.1 | 98.3 | 59.7 | 26.5 | 9.1 |

As is clear in Table 3, when the hydrogen chloride gas is contained in the mixture gas with a content of 5 to 50 percent by mole, the result is obtained with a high yield of the whisker crystalline silicon carbide. Through elementary and X-ray analysis, it was recognized that when the content of the hydrogen chloride in the mixture gas was 10 to 40 percent by mole, the result was a high purity of silicon carbide, whereas when the content was 5 or less or 50 or a higher percent by mole, the result had lower physical properties owing to a certain transition defect of the resultant crystal. Further, when the content of the hydrogen chloride in the mixture gas was 2.5 or less or 60 or a greater percent by mole, the result had an extremely lower yield and an extremely shorter length and a much lower tensile strength of the whisker crystal.

EXAMPLE 4

Five alumina tubes having an internal diameter of 2.4 cm and a length of 60 cm were charged with 0.4, 0.8, 1.6, 2.4 and 4.8 g of silicon dioxide grains having a purity of 99 percent by weight, respectively. The tubes were subjected to the same procedure as that of Example 1 except that the effective length of the tube heated to 1000°C or higher was 20 cm. Table 4 shows relationships between the charges of the silicon dioxide in the alumina tube and yields of the resultant silicon carbide.

Table 4

| Charge of silicon dioxide in alumina tube (g) | 0.4 | 0.8 | 1.6 | 2.4 | 4.8 |
|---|---|---|---|---|---|
| Yield of silicon carbide (% by weight) | 95 | 91 | 76 | 32 | 8 |

EXAMPLE 5

Six alumina tubes having an internal diameter of 5.2 cm and a length of 70 cm were charged with 12 g of ferro-silicon (iron-silicon alloy) containing 75 percent by weight of silicon, respectively. The tubes were heated so that the contents therein were heated to respective temperatures of 800°, 100°, 1200°, 1500°, 1600° and 1800°C, and a mixed gas consisting of 78.0 percent by mole of n-pentane gas, which was previously gasified by heating it, and 22.0 percent by mole of hydrogen chloride were introduced into the respective tubes at a flow rate of 60 ml/min for 3 hours in order to react them. After the reaction was completed, the resultant whisker crystalline silicon carbides were collected from all the tubes with yields as shown in Table 5.

Table 5

| Reaction temperature (°C) | 800 | 1000 | 1200 | 1500 | 1600 | 1800 |
|---|---|---|---|---|---|---|
| Yield of whisker crystalline silicon carbide (% by weight) | 0 | 6.7 | 86.9 | 95.5 | 97.0 | 91.1 |

As clearly shown in Table 5, it is necessary for obtaining the whisker crystalline silicone carbide that the reaction system is heated to a high temperature of 1000°C or higher. Particularly, in order to obtain the whisker crystalline silicon carbide with a high yield, it is required that the reaction is carried out at a high temperature of 1200°C or higher. However, when the reaction temperature is unnecessarily high for example, higher than 1800°C, the alumina tube and the heating furnace are not only undesirably worn and torn, but the fuel cost for the heating furnace undesirably becomes very high.

EXAMPLE 6

A stainless steel tube having an internal diameter of 4 cm and a length of 30 cm which was put on a porous ceramic stand, was charged with 50 g of a precipitated silicon dioxide powder having an average particle size of 100 μm. The stainless steel tube was connected to a silimanite tube having an internal diameter of 3 cm and a length of 50 cm through a heat resisting pipe. First of all, the pressure in the tube system was reduced to 1 mmHg, the stainless steel tube and the silimanite tube were heated to respective temperatures of 700° and 1400°C, and then, a mixed gas consisting of 1 part by volume of chlorine gas and 2 parts by volume of propane gas was introduced into the tube system through an upper end of the stainless steel tube with a flow rate of 1.5 l/minute. Accordingly, the mixed gas passed through the stainless steel tube heated at a temperature of 700°C, was blown through the silimanite tube of 1400°C. Through the above process, the tube system was maintained at atmospheric pressure by controlling the flow rate of the exhaust gas from the silimanite tube. After the reaction was maintained for 3 hours under the above conditions, the flowing of the mixed gas was stopped, the silimanite tube was taken out from a heating means and cooled to room temperature and then the result in the silimanite tube, which result was white whisker crystals, was collected. The resultant whisker crystals had a weight of 4.2 g. Through an X-ray analysis, it was recognized that the result was a pure β-type silicon carbide. The resultant whisker crystal had a diameter of about 0.8 μm, a length of about 10 mm and physical properties such as a tensile strength of about 2,300 kg/mm² and a modulus of longitudinal elasticity of about 52,000 kg/mm².

For comparison, the above procedure was repeated at the stainless steel tube temperature of 350°C instead of 700°C. No whisker crystal was found in the similanite tube.

EXAMPLE 7

A rotatable screw means for agitating was disposed in the same stainless steel tube as that of Example 6. The stainless steel tube was charged with 50 g of a precipitated silicon dioxide powder and connected to a silimanite tube as used in Example 1 through a heat resisting pipe. After the pressure of the tube system formed thus was reduced to a pressure of 1 mmHg, the content of the stainless steel tube was heated to a temperature of 800°C while agitating the contents with the screw means. A dried chlorine gas was introduced into the tube system through an end of the stainless steel tube at a flow rate of 0.3 l/min. Further, a fine powder of a petroleum blown asphalt was introduced into the tube system through an upper end of stainless steel tube at a flow rate of 0.2 g/min. Accordingly, the gas discharged from the stainless steel tube was successively introduced into the silimanite tube heated to a temperature of 1500°C, and a discharging flow rate of an exhaust gas from the silimanite tube was adjusted so as to maintain the inner pressure of the tube system at 1 atm. After the tube system was maintained for 2 hours under the above condition, the reaction was stopped and the tube system was allowed to cool to room temperature. The result was white whisker crystalline silicon carbide having a weight of 3.1 g. The whisker crystal had a diameter of about 0.5 to about 1.0 μm, a length of about 5 to about 10 mm.

EXAMPLE 8

A mullite tube having an internal diameter of 5 cm and a length of 100 cm was charged with 30 g of fine powder of a siliceous sand in an upper portion thereof. After the mullite tube was completely evacuated, the upper portion of the tube containing the siliceous sand was heated to a temperature of 900°C whereas the lower portion of the tube was heated to 1450°C temperature. Next, a chlorine gas stream of a flow rate of 0.2 l/min and a methyl chloride stream of a flow rate of 0.2 l/min were mixed and the resultant mixed gas was introduced into the mullite tube through an upper end thereof, and an exhaust gas was discharged from the tube through a bottom end thereof while maintaining the inner pressure of the tube at 1.0 atm by controlling the discharging flow rate of the exhaust gas. After the tube was maintained under the above condition for 4 hours, the feeding of the gases was stopped, the tube was cooled to room temperature and then the result was collected from the mullite tube. The result was 5.6 g of a white whisker crystalline silicon carbide having a diameter of 0.3 to 1.0 μm and a length of 5 to 15 mm.

EXAMPLE 9

The same tube system as that of Example 6 was prepared from the stainless steel tube, the silimanite tube and the heat resisting pipe and air in the tube system was completely exhausted. The stainless steel tube and the silimanite tube were heated to respective temperatures of 500°C and 1350°C.

First, a dried chlorine gas was introduced into the tube system through a bottom end of the stainless steel tube and a mixture of 2 parts by weight of powdered metasilicic acid, 0.8 parts by weight of powdered polyethylene and 0.2 parts of powdered chlorinated polyethylene were also introduced into the tube system through the bottom end of the stainless steel tube at a flow rate of 0.5 g/min. Accordingly, a gas produced in the stainless steel tube was immediately introduced into the silimanite tube. The tube system was maintained at a pressure higher by 0.5 kg/cm² than atmospheric pressure over 3 hours by controlling a flow rate of exhaust gas from the tube system. After cooling the tube system to room temperature, the silimanite tube was taken out from a heating means and the result in the silimanite tube was collected. The result was a white whisker crystalline silicon carbide of a weight of 3.8 g, a diameter of 0.1 to 0.7 μm and a length of 3 to 15 mm.

EXAMPLE 10

A mullite tube, an internal diameter of which was 4 cm and a length of 80 cm, was charged with 50 g of finely powdered siliceous stone and completely exhausted air in the tube. The mullite tube was heated to a temperature of 1550°C. A dried hydrogen chloride gas flowing at a flow rate of 0.4 l/min was mixed with a mixed gas prepared by flowing hydrogen gas through a benzene bath maintained at a temperature of 30°C at a flow rate of 0.6 l/min and the final mixed gas was introduced into the mullite tube through a bottom end thereof while maintaining the pressure in the tube at 1 atm by controlling a flow rate of exhaust gas from the tube. The reaction was carried out for 5 hours under the above condition. After the tube was cooled to room temperature, the product in the mullite tube was collected. The resultant product was whisker crystalline silicon carbide, a weight of which was 6.5 g. The crystals had a diameter of 0.5 to 1.2 μm, a length of 2 to 10 mm, a tensile strength of 2,400 kg/mm², and a modulus of longitudinal elasticity of 55,000 kg/mm².

EXAMPLE 11

The same tube system as that of Example 6 was prepared from the stainless steel tube, the silimanite tube and the heat resisting pipe and air therein was completely exhausted therefrom. The stainless steel and silimanite tubes were heated to respective temperatures of 800° and 1450°C. A mixture gas of 1 part by volume of dried chlorine gas and 2 parts by volume of propane gas was introduced into the tube system at 1.5 l/min through a bottom end of the system. At the same time, powdered silicon dioxide was introduced into the system through an opposite end thereof at a flow rate of 0.5 g/min. An exhaust gas from the system was discharged through an opposite end of the system at a flow rate adjusted so as to maintain a pressure in the tube system at 1 atm. The above process was carried out for 3 hours. The tube system was cooled to room temperature and the product collected from the silimanite tube had a weight of 4.5 g.

Through X-ray analysis, it was recognized that the product was β-type whisker crystalline silicon carbide having a diameter of 0.5 to 1.4 μm and a length of 5 to 16 mm.

COMPARISON EXAMPLE 1

The same stainless steel tube as that of Example 6 was charged with 30 g of a precipitated silicon dioxide powder and 12 g of a powdered active carbon, and connected to the silimanite tube through the heat resisting tube as stated in Example 6. After the tube system was reduced to the pressure of 1 mmHg, the stainless steel tube and the silimanite tube were heated to respective temperatures of 700° and 1400°C. A dried chlorine gas was introduced into the tube system through an upper end of the stainless steel tube at a flow rate of 0.5 l/min, the exhaust gas from the stainless steel tube was mixed with propane gas flowing at a flow rate of 1 l/min, the mixed gas was immediately introduced into the silimanite tube. The tube system was maintained at a pressure of 1 atm by controlling a flow rate of an exhaust gas from the silimanite tube. After the tube system was maintained under the above conditions for 3 hours, the feeding of the gases were stopped, the tube system was cooled to room temperature. No product was found.

COMPARISON EXAMPLE 2

The same stainless steel tube as that of Example 6 was charged with 30 g of a precipitated silicon dioxide powder and 12 g of a finely powdered graphite. An agitator means was disposed in the stainless steel tube in order to agitate the charged powder. The stainless steel tube was connected to the silimanite tube through the heat resisting pipe as stated in Example 6. After the tube system formed thus was evacuated of air and subsequently formed into a vacuum, the stainless steel and silimanite tubes were heated to respective temperatures of 1000° and 1500°C. A dried hydrogen chloride gas was fed into the tube system through a bottom end of the stainless steel tube at a flow rate of 0.3 l/min, and the exhaust gas from the stainless steel tube through an opposite end thereof was immediately fed into the silimanite tube. At the same time, a finely powdered petroleum blown asphalt was fed into the tube system through the upper end of the stainless steel tube at a flow rate of 0.2 g/min. The tube system was maintained at a pressure of 1 atm by controlling a flow rate of an exhaust gas therefrom. After the tube system was maintained under the above condition for 2 hours, the tubes were cooled to room temperature. No product was found in the tubes.

EXAMPLE 12

A stainless steel tube having an internal diameter of 4 cm and a length of 30 cm was charged with 200 g of metallic silicon grains having a purity of 96 percent, reduced to a pressure of 1 mmHg and then heated so that the content was heated to a temperature of 330°C. A dried chlorine gas was fed into the heated tube at a flow rate of 0.8 l/min. An exhaust gas from the stainless steel tube was mixed with propane gas flowing at rate of 0.8 l/min and the mixed gas was fed into a silimanite tube of which an internal diameter was 3 cm and a length of 50 cm, which was reduced to a pressure of 1 mmHg and heated to a temperature of 1500°C. The silimanite tube was maintained at a pressure higher by 1 kg/cm² than atmosphere for 2 hours by controlling a flow rate of exhaust gas therefrom. After the above process was completed, the feeding of the gases was stopped, the silimanite tube was cooled to room temperature and then the resultant white whisker crystals in the silimanite tube were collected. The result had a weight of 6.8 g corresponding to a yield of 72 percent by weight in calculation from the original weight of the metallic silicon. Through elementary analysis, it was recognized that the result was silicon carbide having a purity of 98 percent by weight. The resultant whisker crystals had a diameter of about 0.7 μm, a length of about 8 mm, a tensile strength of 2,300 kg/mm² and a modulus of longitudinal elasticity of 52,000 kg/mm².

EXAMPLE 13

The same stainless steel tube as that of Example 12 with an agitator means was reduced to an inner pressure of 1 mmHg, heated to an inner temperature of 300°C, and then charged with a powdered alloy consisting of 80 parts by weight of silicon and 20 parts by weight of copper through a lower end thereof at a flow rate of 2 g/min while rotating the agitator means at 50 rpm. Vapor of tetrachloromethane, which was prepared by boiling liquid tetrachloromethane in a container separate from the above tube, was fed into the stainless steel tube at a flow rate of 2 l/min. On the other hand, toluene vapor, which was evaporated in a container separate from the tetrachloromethane container at a rate of 3 l/min, was unformly mixed with exhaust gas from the stainless steel tube, and the mixed gas was introduced into an alumina tube having the same size as that of the silimanite tube of Example 12, which tube was maintained at a pressure of 1 mmHg and heated at an inner temperature of 1800°C. The exhaust gas from the alumina tube was discharged to atmosphere so as to maintain the alumina tube at a pressure higher by 1.8 kg/cm² than atmosphere.

The tube system was maintained under the above condition for 1.5 hours and thereafter, the processing was stopped, the alumina tube was taken out from the system and cooled to room temperature. The result in the alumina tube was collected, 5.2 g of white whisker crystals were obtained.

Basing upon the original content of the silicon in the alloy, it was found that the yield of the silicon carbide was 81 percent by weight. The resultant whisker crystals had a diameter of about 0.5 to about 1.0 μm and a length of about 5 to about 10 mm.

EXAMPLE 14

A mullite tube having an internal diameter of 4 cm and a length of 40 cm was charged with 100 g of powdered meta-silicic acid, and air therein was sufficiently exhausted therein and then heated to an inner temperature of 1300°C. Dried hydrogen chloride gas was fed into the mullite tube through a bottom end thereof at a flow rate of 1.5 l/min. An exhaust gas from the mullite tube was mixed with a mixed gas which was prepared by flowing hydrogen gas through a xylene bath at a temperature of 100°C while flowing at a rate of 2 l/min, and the final mixed gas was fed into an alumina tube having an internal diameter of 6 cm and a length of 50 cm, which tube was heated to an inner temperature of 1600°C and sufficiently evacuated of air therein. A portion of an exhaust gas from the alumina tube was dried by passing same at room temperature through a tube filled with active alumina, and recycled to the alumina tube of 1600°C temperature so as to maintain the alumina tube at an inner pressure higher by 1.2 kg/cm² than atmosphere. After the alumina tube was maintained under the above condition for 4 hours, the alumina tube was taken out from the heating means. The product in the alumina tube was 8.5 g of whisker crystalline silicon carbide, which weight corresponded to a yield of 68 percent based on the original weight of the metasilicic acid. The resultant whisker crystals had a diameter of 0.1 to 0.7 μm, a length of 3 to 15 mm, a tensile strength of 2,500 kg/mm² and a modulus of longitudinal elasticity of 56,000 kg/mm².

EXAMPLE 15

The same mullite tube as that used in Example 14 was charged with 80 g of a mixture of finely powdered siliceous sand and powdered active carbon in a proportion of 2 : 1, and sufficiently exhausted air therein and heated to an inner temperature of 1250°C. Dried chlorine gas was fed into the mullite tube through a bottom end thereof at a flow rate of 0.5 l/min. Liquid paraffin was gasified in a container at a temperature of 200°C, introduced at a flow rate of 0.4 l/min and mixed with an exhaust gas from the mullite tube. The mixed gas was introduced into an alumina tube, the same as that of Example 14, and heated to a temperature of 1,500°C and sufficiently evacuated of air.

An exhaust gas from the alumina tube was discharged at a flow rate so adjusted as to maintain the alumina tube at an inner pressure higher by 1.8 kg/cm² than atmosphere. After maintaining the alumina tube under the above condition for 1 hour, the product in the alumina tube was collected. 4.1 g of whisker crystalline silicon carbide were obtained. The result corresponded to a yield of 88 percent based on the original weight of the siliceous sand. The resultant whisker crystals had a diameter of 0.5 to 1.2 μm and a length of 2 to 10 mm.

EXAMPLE 16

The same stainless steel tube with the agitator means as that of Example 13 was charged with a mixture of 150 g of powdered metallic silicon having a purity of 88 percent by weight and 20 g cuprous chloride. After sufficiently exhausting air from the stainless steel tube, the tube was heated to an inner temperature of 350°C. Methyl chloride gas was fed into the stainless steel tube through a bottom end thereof at a flow rate of 3 l/min while agitating the content in the tube at a rotation of 100 rpm. An exhaust gas from the stainless steel tube was fed into a zirconia tube having an internal diameter of 5 cm and a length of 40 cm, heated to an inner temperature of 1900°C and sufficiently evacuated through an end thereof.

The zirconia tube was maintained at an inner pressure higher by 1.6 kg/cm² than atmosphere while discharging an exhaust gas through an opposite end thereof.

After 5 hours, the zirconia tube was taken out from a heating means and the product in the zirconia tube was collected. 12.8 g of whisker crystalline silicon carbide was obtained. This result corresponded to a yield of 66 percent based on the original weight of the metallic silicon. The resultant whisker crystals had a diameter of 0.8 to 1.5 μm and a length of 2 to 7 mm.

EXAMPLE 17

A stainless steel tube having an internal diameter of 5 cm and a length of 40 cm and provided with an agitator means was reduced to an inner pressure of 2 mmHg and heated to an inner temperature of 700°C. The evacuated and heated stainless steel tube was charged with a mixture containing 1 part by weight of a primary mixture which consisted of 1 part of powdered polyvinyl chloride, 2 parts of powdered polyethylene and 2 parts of powdered silicon dioxide through a bottom end thereof at a flow rate of 1 g/min while rotating the agitator at a rotation of 35 rpm. An exhaust gas from the stainless steel tube was fed into a mullite tube having an internal diameter of 6 cm and a length of 60 cm and which tube was previously evacuated sufficiently and heated to an inner temperature of 1400°C. An exhaust gas from the mullite tube was recycled to the stainless steel tube through a heat resisting connection pipe while maintaining the tube system at an inner pressure higher by 2 kg/cm² than atmosphere. After the tube system was maintained under the above conditions for 3 hours, the mullite tube was taken out from the heating means and the result in the mullite tube was collected. 10.1 g of white whisker crystalline silicon carbide were obtained. This result corresponded to a yield of 85 percent based on the original weight of the silicon dioxide. The resultant whisker crystals had a diameter of 0.3 to 1.0 μm and a length of 2 to 8 mm.

EXAMPLE 18

A mixture containing 50 g of powdered metallic silicon having a purity of 92 percent by weight and 50 g of powdered chlorinated polyethylene was charged into a stainless steel autoclave having volume capacity of 1 l and a maximum pressure resistance of 350 atm. The charged autoclave was sufficiently evacuated and heated to an inner temperature of 600°C. An exhaust gas from the autoclave was fed into a silimanite tube having an internal diameter of 6 cm and a length of 60 cm and heated to an inner temperature of 1500°C at a flow rate of 2 l/min while maintaining the autoclave under a pressure of 110 kg/cm ² Gauge. An exhaust gas from the silimanite tube was discharged outside the reaction system. After the tube system was maintained under the above conditions for 2 hours, the flow of the gases was stopped and the silimanite tube was taken out from the heating means. 7.8 g of whisker crystalline silicon carbide were obtained from the silimanite tube. This result corresponded to a yield of 73 percent based on the original weight of the metallic silicon. The resultant whisker crystals had a diameter of about 0.6 μm and a length of about 8 mm.

EXAMPLE 19

An alumina tube having an internal diameter of 2.4 cm and a length of 60 cm was charged with 0.42 g of metallic silicon and then set in a horizontal heating furnace.

A mixed gas of ethylene and hydrogen chloride gases containing 28 percent by mole of chlorine was fed into the alumina tube heated to a temperature 1450°C at a flow rate of 13 ml/min for 2 hours and an exhaust gas from the alumina tube was discharged to atmosphere.

0.552 g of whisker crystalline silicon carbide were obtained. This result corresponded to a yield of 92 percent.

In the above process, the relationship between the flow rate of the mixed gas and the yield of the resultant silicon carbide is shown in Table 6.

Table 6

| Flow rate of mixed gas (ml/min) | 1.5 | 3.2 | 13 | 30 | 50 | 90 | 180 |
|---|---|---|---|---|---|---|---|
| Yield of silicon carbide (%) | 9.8 | 31 | 92 | 89 | 80 | 24 | 21 |

In consideration of Table 6, it was concluded that the flow rates of the mixed gas higher than 3.2 ml/min are preferable for obtaining high yield of the silicon carbide. These preferable flow rates corresponded to rates higher than 0.7 ml/min with respect to the reaction tube's cross-sectional area of 1 cm² through which the mixed gas flowed.

What we claim is:

1. A process of manufacturing whisker crystalline silicon carbide which comprises heating a reaction system containing
   1. a solid phase consisting essentially of fine solid particles of silicon dioxide-containing inorganic material, and
   2. a gaseous mixture consisting essentially of chlorine-containing material and aliphatic hydrocarbon,
      said chlorine-containing material being selected from the group consisting of chlorine, hydrogen chloride, tetrachloromethane and phosgene,
   the reaction system being heated to a reaction temperature of 800 to 2200°C in the substantial absence of oxygen and nitrogen to produce crystalline silicon carbide whiskers.

2. A process according to claim 1, in which said reaction system contains as sole reactants therein said solid particles of silicon dioxide-containing inorganic material and said mixture (2) in the gas phase, said reaction system being free of solid elemental carbon.

3. A process as claimed in claim 1, wherein said heating temperature is from 1000° to 2200°C.

4. A process as claimed in claim 1, wherein said heating temperature is from 1200° to 2000°C.

5. A process as claimed in claim 1, wherein said reaction system is preheated to a temperature not lower than 100°C and below the reaction temperature, and then is further heated to said reaction temperature.

6. A process as claimed in claim 5, wherein said preheating temperature is not lower than 400°C.

7. A process as claimed in claim 5, wherein said preheating temperature is not lower than 800°C.

8. A process as claimed in claim 1, wnerein said mixture (2) is preheated to a temperature not lower than 100°C and below the reaction temperature and then is mixed with said silicon dioxide-containing inorganic material and then is heated to said reaction temperature.

9. A process as claimed in claim 1, in which the silicon dioxide containing inorganic material is placed in a receptacle in the reaction system and is heated to said reaction temperature, and a gaseous phase of said mixture (2) is blown thereacross for a period of time until the silicon is converted to silicon carbide whiskers.

10. A process as claimed in claim 1, wherein said silicon dioxide-containing inorganic material is selected from the group consisting of, silicon dioxide, portland cement, white portland cement, glass siliceous stone, siliceous sand, feldspar, kaolin and sintered materials from siliceous stone, siliceous sand, feldspar and kaolin.

* * * * *